(12) United States Patent
Shin et al.

(10) Patent No.: US 12,019,578 B2
(45) Date of Patent: Jun. 25, 2024

(54) PARALLEL-TO-SERIAL INTERFACE CIRCUIT AND TRANSMISSION DEVICE HAVING THE SAME

(71) Applicant: SAMSUNG ELECTRONICS CO., LTD., Suwon-si (KR)

(72) Inventors: Eunseok Shin, Seoul (KR); Woochul Jung, Hwaseong-si (KR); Jungho Ko, Seoul (KR); Myoungbo Kwak, Seoul (KR); Jaewoo Park, Yongin-si (KR); Sunjae Lim, Seoul (KR); Junghwan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 134 days.

(21) Appl. No.: 17/899,883

(22) Filed: Aug. 31, 2022

(65) Prior Publication Data

US 2023/0185754 A1    Jun. 15, 2023

(30) Foreign Application Priority Data

Dec. 9, 2021    (KR) .................. 10-2021-0175618

(51) Int. Cl.
| | | |
|---|---|---|
| *G06F 13/42* | (2006.01) | |
| *G06F 13/38* | (2006.01) | |
| *H03K 17/687* | (2006.01) | |
| *H03M 9/00* | (2006.01) | |

(52) U.S. Cl.
CPC ...... *G06F 13/4204* (2013.01); *G06F 13/4282* (2013.01); *H03M 9/00* (2013.01); *G06F 2213/0002* (2013.01); *G06F 2213/0004* (2013.01); *H03K 17/6871* (2013.01)

(58) Field of Classification Search
CPC .......... G06F 13/4204; G06F 13/4282; G06F 2213/0002; G06F 2213/0004; G06F 13/38; G06F 2213/3852; H03M 9/00; H03K 17/6871
USPC ................ 710/6, 20, 29, 58, 71, 105, 315
See application file for complete search history.

(56) References Cited

U.S. PATENT DOCUMENTS

| | | | |
|---|---|---|---|
| 5,798,720 A | 8/1998 | Yano | |
| 8,619,931 B1 * | 12/2013 | Pham | H04L 7/002 375/355 |
| 9,160,520 B1 | 10/2015 | Hwang et al. | |
| 9,419,736 B2 | 8/2016 | Bae et al. | |
| 9,853,642 B1 * | 12/2017 | Tan | H03M 9/00 |

(Continued)

*Primary Examiner* — Idriss N Alrobaye
*Assistant Examiner* — Henry W Yu
(74) *Attorney, Agent, or Firm* — Muir Patent Law, PLLC

(57) ABSTRACT

A parallel-to-serial interface circuit includes an equalizer to delay odd data by a half period and sequentially generate odd pre data, odd main data, and odd post data, and delay even data by a half period and sequentially generate even pre data, even main data, and even post data, a final parallel-to-serial converter to sequentially and alternately select the even pre data and the odd pre data to generate pre data, sequentially and alternately select inverted odd main data and inverted even main data to generate inverted main data, and sequentially and alternately select the even post data and the odd post data to generate post data, and a driver to drive the pre data to generate a pre data level, drive the inverted main data to generate an inverted main data level, and drive the post data to generate a post data level.

20 Claims, 9 Drawing Sheets

(56) References Cited

U.S. PATENT DOCUMENTS

| | | |
|---|---|---|
| 10,257,121 B1 | 4/2019 | Qin et al. |
| 10,728,060 B2 | 7/2020 | Peng et al. |
| 10,892,775 B1 | 1/2021 | Katta et al. |
| 10,962,933 B1 * | 3/2021 | Waltari ................. H03M 1/164 |
| 2019/0371371 A1 * | 12/2019 | Park .................... G11C 7/1051 |
| 2020/0106439 A1 * | 4/2020 | Funabashi ........ H03K 19/00346 |

* cited by examiner

PARALLEL-TO-SERIAL INTERFACE CIRCUIT AND TRANSMISSION DEVICE HAVING THE SAME

CROSS-REFERENCE TO RELATED APPLICATION

This application claims priority from Korean Patent Application No. 10-2021-0175618, filed on Dec. 9, 2021, in the Korean Intellectual Property Office, the disclosure of which is incorporated herein by reference in its entirety.

BACKGROUND

1. Field

Embodiments relate to a parallel-to-serial interface circuit and a transmission device having the same.

2. Description of the Related Art

A transmission and reception system includes a transmission device and a reception device. The transmission device includes a parallel-to-serial interface circuit for converting internally generated parallel data into serial data to transmit the serial data. The parallel-to-serial interface circuit performs a parallel-to-serial conversion operation of converting parallel input data in series to generate output data.

SUMMARY

Embodiments are directed to a parallel-to-serial interface circuit, including: a parallel-to-serial converter configured to convert parallel data in series in response to a first clock signal to generate odd data and even data; an equalizer configured to shift the odd data in response to a second clock signal to delay the odd data by a half period of the second clock signal and sequentially generate odd pre data, odd main data, and odd post data, and shift the even data in response to the second clock signal to delay the even data by a half period of the second clock signal and sequentially generate even pre data, even main data, and even post data; a final parallel-to-serial converter configured to, in response to a third clock signal, sequentially and alternately select the even pre data and the odd pre data to generate pre data, sequentially and alternately select inverted odd main data obtained by inverting the odd main data and inverted even main data obtained by inverting the even main data to generate inverted main data, and sequentially and alternately select the even post data and the odd post data to generate post data; and a driver configured to drive the pre data based on a pre-cursor coefficient to generate a pre data level, drive the inverted main data based on a main-cursor coefficient to generate an inverted main data level, and drive the post data based on a post-cursor coefficient to generate a post data level, wherein the first clock signal and the third clock signal are generated by being supplied with a first internal power supply voltage and a second internal power supply voltage separated from each other, the odd pre data is generated at the same time as the even main data, and the pre data level, the inverted main data level, and the post data level are summed at an output node of the driver.

Embodiments are directed to a parallel-to-serial interface circuit, including: a parallel-to-serial converter configured to convert parallel data in series in response to a first clock signal to generate odd data and even data; an equalizer configured to shift the odd data in response to a second clock signal to delay the odd data by a half period of the second clock signal and sequentially generate odd pre data, odd main data, and odd post data, and shift the even data in response to the second clock signal to delay the even data by a half period of the second clock signal and sequentially generate even pre data, even main data, and even post data; an equalizer selection unit configured to, in response to an equalizer enable signal, select and output the even pre data and the odd pre data, select and output inverted odd main data obtained by inverting the odd main data and inverted even main data obtained by inverting the even main data, and select and output the even post data and the odd post data; a differential data generator configured to, in response to a third clock signal, generate a differential even pre data pair including the even pre data and inverted even pre data obtained by inverting the even pre data, a differential odd main data pair including the inverted odd main data and odd main data obtained by inverting the inverted odd main data, and a differential post data pair including the even post data and inverted even post data obtained by inverting the even post data, or generate a differential odd pre data pair including the odd pre data and inverted odd pre data obtained by inverting the odd pre data, a differential even main data pair including the inverted even main data and even main data obtained by inverting the inverted even main data, and a differential odd post data pair including the odd post data and inverted odd post data obtained by inverting the odd post data; a final parallel-to-serial converter configured to, in response to a fourth clock signal, sequentially and alternately select the differential even pre data pair and the differential odd pre data pair to generate a differential pre data pair, sequentially and alternately select the inverted differential odd main data pair and the inverted differential even main data pair to generate an inverted differential main data pair, and sequentially and alternately select the differential even post data pair and the differential odd post data pair to generate a differential post data pair; and a driver configured to drive the differential even pre data pair based on a pre-cursor coefficient to generate a differential pre data level pair, drive the inverted differential main data pair based on a main-cursor coefficient to generate an inverted differential main data level pair, and drive the differential post data pair based on a post-cursor coefficient to generate a differential post data level pair, and wherein the first clock signal and the fourth clock signal are generated by being supplied with a first internal power supply voltage and a second internal power supply voltage separated from each other, the odd pre data is generated at the same time as the even main data, and the differential pre data level pair, the inverted differential main data level pair, and the differential post data level pair are summed at an output node pair of the driver.

Embodiments are directed to a transmission device, including: a parallel-to-serial interface circuit configured to convert internally generated parallel data in series to output data, wherein the parallel-to-serial interface circuit includes: a parallel-to-serial converter configured to convert the parallel data in series in response to a first clock signal to generate odd data and even data; an equalizer configured to shift the odd data in response to a second clock signal to delay the odd data by a half period of the second clock signal and sequentially generate odd pre data, odd main data, and odd post data, and shift the even data in response to the second clock signal to delay the even data by a half period of the second clock signal and sequentially generate even pre data, even main data, and even post data; a final parallel-to-serial converter configured to, in response to a third clock signal, sequentially and alternately select the even pre data and the odd pre data to generate pre data, sequentially and alternately select inverted odd main data obtained by inverting the odd main data and inverted even main data obtained by inverting the even main data to generate inverted main data, and sequentially and alternately select the even post data and the odd post data to generate post data; and a driver configured to drive the pre data based on a pre-cursor coefficient to generate a pre data level, drive the inverted main data based on a main-cursor coefficient to generate an inverted main data level, and drive the post data based on a post-cursor coefficient to generate a post data level, and wherein the first clock signal and the third clock signal are generated by being supplied with a first internal power supply voltage and a second internal power supply voltage separated from each other, the odd pre data is generated at the same time as the even main data, and the pre data level, the inverted main data level, and the post data level are summed at an output node of the driver.

BRIEF DESCRIPTION OF THE DRAWINGS

Features will become apparent to those of skill in the art by describing in detail example embodiments with reference to the attached drawings in which.

DETAILED DESCRIPTION

Hereinafter, a parallel-to-serial interface circuit and a transmission device having the same according to example embodiments will be described with reference to the accompanying drawings.

Figure 1:
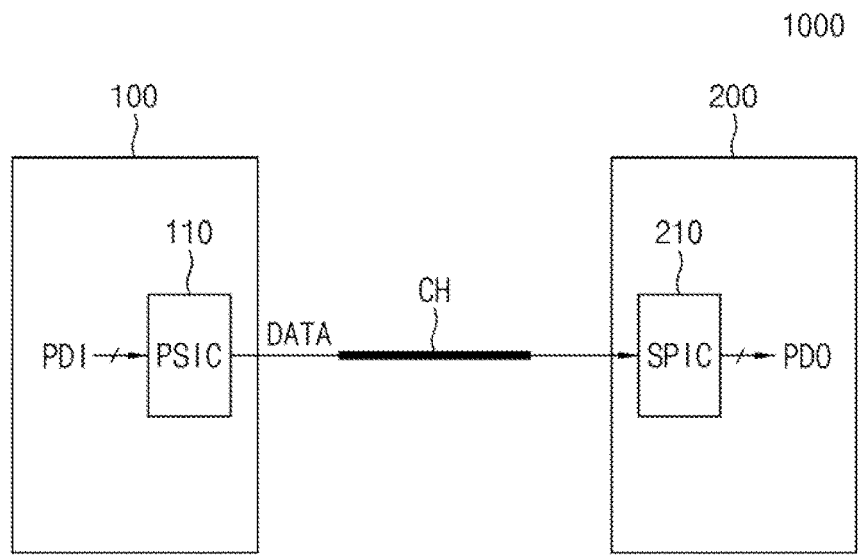
FIG. 1 is a block diagram illustrating a transmission and reception system according to an example embodiment.

FIG. 1 is a block diagram illustrating a transmission and reception system according to an example embodiment.

The transmission and reception system 1000 may include a transmission device 100 and a reception device 200. The transmission device 100 may include a parallel-to-serial interface circuit (PSIC) 110. The reception device 200 may include a serial-to-parallel interface circuit (SPIC) 210.

With reference to FIG. 1, the parallel-to-serial interface circuit 110 may perform a parallel-to-serial conversion operation of converting parallel data PDI in series to generate data DATA, and may also perform a filtering operation of decreasing a low frequency component of the data DATA or increasing a high frequency component of the data DATA to compensate for a distortion that may occur while the data DATA is transmitted through a channel CH. As an example, the data DATA may a differential data pair.

The serial-to-parallel interface circuit 210 may convert the data DATA received in series through the channel CH in parallel to generate data PDO.

As an example, the transmission device 100 may be a solid state drive (SSD) controller, and the reception device 200 may be a central processing unit (CPU). When the transmission device 100 is the SSD controller, the data PDI applied in parallel may be data internally generated in parallel by receiving data applied from a plurality of flash memory devices.

Figure 2:
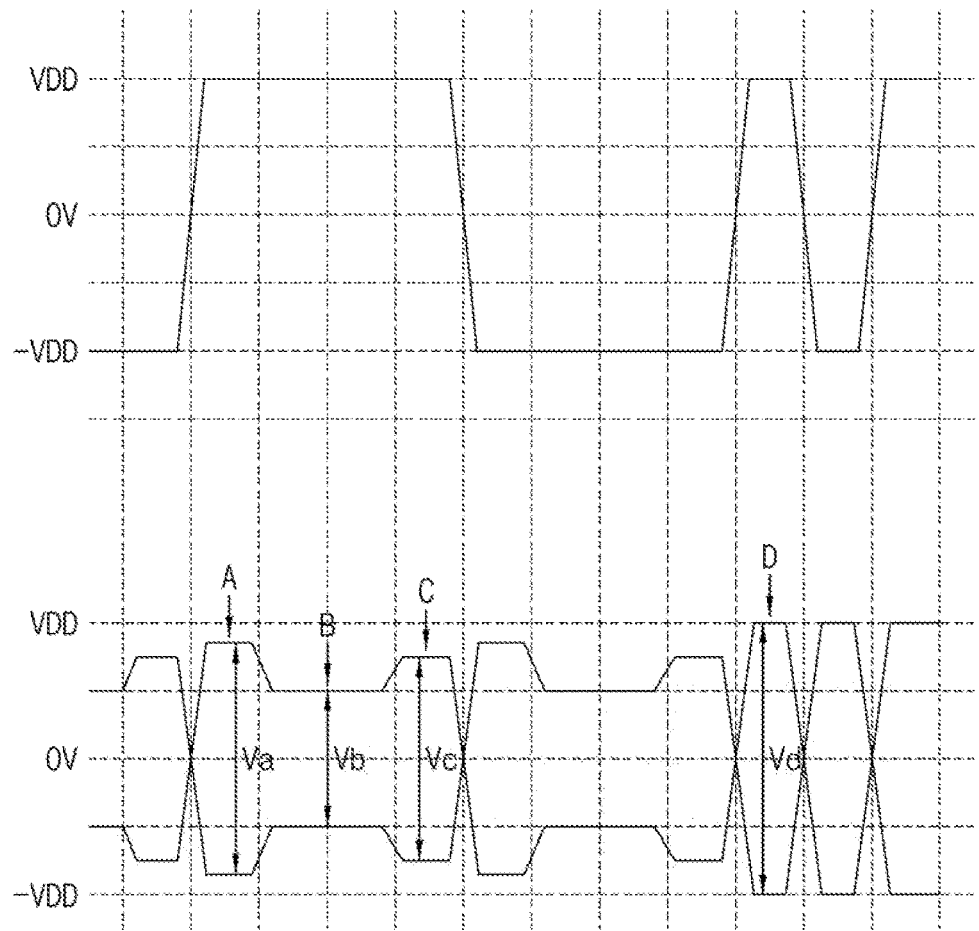
FIG. 2 is a drawing illustrating waveforms of serial data and data according to an example embodiment.

FIG. 2 is a drawing illustrating waveforms of serial data and data according to an example embodiment.

FIG. 2 illustrates a change of data DATA when serial data is "0011110000101" and the data DATA is a differential data pair.

With reference to FIG. 2, the data DATA may be changed in an amplitude of a differential level pair according to a level transition of the serial data. The amplitude of the differential level pair of the data DATA may be a deemphasis voltage Va after the serial data is transited from "0" to "1" or from "1" to "0", may be a flat voltage Vb when the serial data maintains "0" or "1", may be a preshoot voltage Vc after the serial data is transits from "0" to "1" or from "1" to "0", and may be a maximum voltage Vd (for example, 2VDD) when the serial data is transited from "0" to "1" or from "1" to "0" with 1 bit interval. Thus, the data DATA may be generated by decreasing a low frequency component of the serial data and increasing a high frequency component of the serial data. For example, the parallel-to-serial interface circuit 110 may perform a finite impulse response (FIR) filtering operation on the serial data to output the data DATA.

Figure 3:
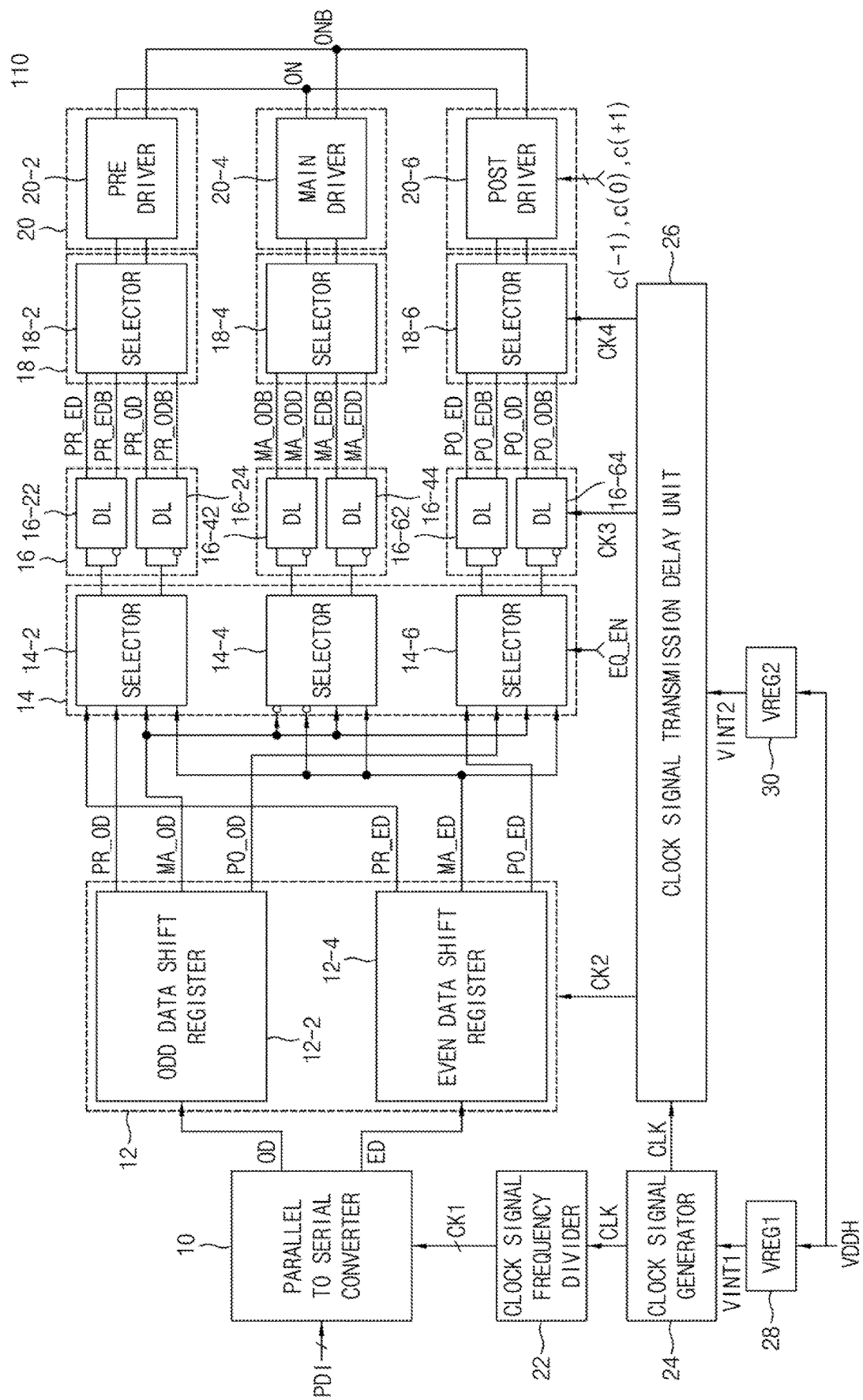
FIG. 3 is a block drawing illustrating a configuration of a parallel-to-serial interface circuit according to an example embodiment.

FIG. 3 is a block drawing illustrating a configuration of a parallel-to-serial interface circuit according to an example embodiment.

The parallel-to-serial interface circuit 110 may include a parallel-to-serial converter 10, an equalizer 12, an equalizer selection unit 14, a differential data generator 16, a final parallel-to-serial converter 18, a driver 20, a clock signal frequency divider 22, a clock signal generator 24, a clock signal transmission delay unit 26, a first internal power supply voltage generator (VREG1) 28, and a second internal power supply voltage generator (VREG2) 30. The equalizer 12 may include an odd data shift register 12-2 and an even data shift register 12-4. The equalizer selection unit 14 may include selectors 14-2, 14-4, and 14-6. The differential data generator 16 may include differential data latches (DL) 16-22, 16-24, 16-42, 16-44, 16-62, and 16-64. The final parallel-to-serial converter 18 may include selectors 18-2, 18-4, and 18-6. The driver 20 may include a pre driver 20-2, a main driver 20-4, and a post driver 20-6.

A function of each of the blocks shown in FIG. 3 will be described below.

The parallel-to-serial converter 10 may receive parallel data PDI, and may convert parallel data PDI in series in response to a first clock signal CK1 to generate odd data OD and even data ED.

The odd data shift register 12-2 may receive the odd data OD, and may shift the odd data OD in response to a second clock signal CK2 to generate odd pre data PR_OD, odd main data MA_OD, and odd post data PO_OD. The odd pre data PR_OD may be odd data prior to the odd main data MA_OD by 1 UI (unit interval) (a half period of the second clock signal CK2), and the odd post data PO_OD may be odd data subsequent to the odd main data MA-OD by 1 UI. The odd data shift register 12-2 may further generate inverted odd main data MA_ODB. The inverted odd main data MA_ODB may be data obtained by inverting the odd main data MA_OD, and may be data having an inversion phase of the odd main data MA_OD.

The even data shift register 12-4 may receive the even data ED, and may shift the even data ED in response to the second clock signal CK2 to generate even pre data PR_ED, even main data MA_ED, and even post data PO_ED. The even pre data PR_ED may be even data prior to the even main data MA_ED by 1 UI (unit interval) (a half period of the second clock signal CK2), and the even post data PO_ED may be even data subsequent to the even main data MA-ED by 1 UI. The even data shift register 12-4 may further generate inverted even main data MA_EDB. The inverted even main data MA_EDB may be data obtained by inverting the even main data MA_ED, and may be data having an inverted phase of the even main data MA_ED.

The selector 14-2 may select and output the even pre data PR_ED and the odd pre data PR_OD when an equalizer enable signal EQ_EN is activated, and may select and output the main odd data MA_OD and the main even data MA_ED when the equalizer enable signal EQ_EN is deactivated.

The selector 14-4 may select and output the inverted odd main data MA_ODB and the inverted even main data MA_EDB when the equalizer enable signal EQ_EN is activated, and may select and output the odd main data MA_OD and the even main data MA_ED when the equalizer enable signal EQ_EN is deactivated.

The selector 14-6 may select and output the even post data PO_ED and the odd post data PO_OD when the equalizer enable signal EQ_EN is activated, and may select and output the odd main data MA_OD and the even main data MA_ED when the equalizer enable signal EQ_EN is deactivated.

The differential data latch 16-22 may latch and output the even pre data PR_ED output from the selector 14-2 and inverted even pre data PR_EDB obtained by inverting the even pre data PR_ED, in response to a third clock signal CK3 when the equalizer enable signal EQ_EN is activated.

The differential data latch 16-24 may latch and output the odd pre data PR_OD output from the selector 14-2 and inverted odd pre data PR_ODB obtained by inverting the odd pre data PR_OD, in response to the third clock signal CK3 when the equalizer enable signal EQ_EN is activated.

The differential data latch 16-42 may latch and output the inverted odd main data MA_ODB output from the selector 14-4 and odd main data MA_ODD obtained by inverting the inverted odd main data MA_ODB, in response to the third clock signal CK3 when the equalizer enable signal EQ_EN is activated.

The differential data latch 16-44 may latch and output the inverted even main data MA_EDB and even main data MA_EDD obtained by inverting the inverted even main data MA_EDB output from the selector 14-4, in response to the third clock signal CK3 when the equalizer enable signal EQ_EN is activated.

The differential data latch 16-62 may latch and output the even post data PO_ED output from the selector 14-6 and inverted even post data PO_EDB obtained by inverting the even post data PO_ED, in response to the third clock signal CK3 when the equalizer enable signal EQ_EN is activated.

The differential data latch 16-64 may latch and output the odd post data PO_OD output from the selector 14-6 and inverted odd post data PO_ODB obtained by inverting the odd post data PO_OD, in response to the third clock signal CK3 when the equalizer enable signal EQ_EN is activated.

On the other hand, each of the differential data latches 16-22, 16-42, and 16-62 may latch and output the odd main data MA_OD and the inverted odd main data MA_ODB output from each of the selectors 14-2, 14-4, and 14-6 in response to the third clock signal CK3 when the equalizer enable signal is deactivated. Each of the differential data latches 16-24, 16-44, and 16-64 may latch and output the even main data MA_ED and the inverted even main data MA_EDB output from each of the selectors 14-2, 14-4, and 14-6 in response to the third clock signal CK3 when the equalizer enable signal EQ_EN is deactivated.

The selector 18-2 may select and output the even pre data PR_ED and the inverted even pre data PR_EDB output from the differential data latch 16-22, or may select and output the odd pre data PR_OD and the inverted odd pre data PR_ODB output from the differential data latch 16-24, in response to a fourth clock signal CK4 when the equalizer enable signal EQ_EN is activated.

The selector 18-4 may select and output the inverted odd main data MA_ODB and the odd main data MA_ODD output from the differential data latch 16-42, or may select and output the inverted even main data MA_EDD and the even main data MA_EDD output from the differential data latch 16-44, in response to the fourth clock signal CK4 when the equalizer enable signal EQ_EN is activated.

The selector 18-6 may select and output the even post data PO_ED and the inverted even post data PO_EDB output from the differential data latch 16-62, or may select and output the odd post data PO_OD and the inverted odd post data PO_ODB output from the differential data latch 16-62, in response to the fourth clock signal CK4 when the equalizer enable signal EQ_EN is activated.

On the other hand, each of the selectors 18-2, 18-4 and 18-6 may select and output the odd main data MA-ODD and the inverted odd main data MA_ODB output from each of the differential data latches 16-22, 16-42, and 16-62, or may select and output the even main data MA_EDD and the inverted even main data MA_EDB output from the differential data latches 16-24, 16-44, and 16-64, in response the fourth clock signal CK4 when the equalizer enable signal EQ_EN is deactivated.

The pre driver 20-2 may drive a differential pre data pair (that is, a differential even pre data pair PR_ED and PR_EDB or a differential odd pre data pair PR_OD and PR_ODB output from the selector 18-2 based on a precursor coefficient (for example, $c(-1)$) to output a differential pre data level pair, when the equalizer enable signal EQ_EN is activated.

The main driver 20-4 may drive a differential main data pair (that is, an inverted differential even main data pair MA_EDB and MA_EDD or an inverted differential odd main data pair MA_ODB and MA_ODD) output from the selector 18-4 based on a main-cursor coefficient (for example, c(0)) to output an inverted differential main data level pair, when the equalizer enable signal EQ_EN is activated.

The post driver 20-6 may drive a differential post data pair (that is, a differential even post data pair PO_ED and PO_EDB or a differential odd pre data pair PO_OD and PO_ODB) output from the selector 18-6 based on a post-cursor coefficient (for example, c(+1)) to output a differential post data level pair, when the equalizer enable signal EQ_EN is activated.

The equalizer enable signal EQ_EN, the pre-cursor coefficient c(−1), the main-cursor coefficient c(0), and/or the post-cursor coefficient c(+1) may be transmitted from the reception device 200, or may be preset.

The differential pre data level pair, the inverted differential main data level pair, and the differential post data level pair may be summed at an output node pair ON and ONB to output a data pair DATA.

The clock signal frequency divider 22 may receive a reference clock signal CLK, and may divide a frequency of the reference clock signal CLK to output the first clock signal CK1.

The clock signal generator 24 may be supplied with a first internal power supply voltage VINT1 to generate the reference clock signal CLK. The clock signal generator 24 may be a phase locked loop (PLL) circuit.

The clock signal transmission delay unit 26 may be supplied with a second internal power supply voltage VINT2, and may receive and delay the reference clock signal CLK to generate the second clock signal CK2, a third clock signal CK3, and a fourth clock signal CK4.

The first internal power supply voltage VINT1 may have the same level as, or a different level from, the second internal power supply voltage VINT2.

The first internal power supply voltage generator 28 may generate the first internal power supply voltage VINT1 using a power supply voltage VDDH supplied from the outside.

The second internal power supply voltage generator 30 may generate the second internal power supply voltage VINT2 using the power supply voltage VDDH.

Although not shown in FIG. 3, a power supply voltage VDD supplied from the outside may be supplied to the parallel-to-serial converter 10, the equalizer 12, the equalizer selection unit 14, the differential data generator 16, the final parallel-to-serial converter 18, and the driver 20. The power supply voltage VDD may have the same level as, or a different level from, the power supply voltage VDDH.

With reference to FIG. 3, in the parallel-to-serial interface circuit 110 according to an example embodiment, final serial data may be generated from the final parallel-to-serial converter 18 located at a previous stage of the driver 20 in response to the fourth clock signal CK4. Accordingly, jitter due to a power supply voltage noise that may occur before the final parallel-to-serial converter 18 may be removed at the final parallel-to-serial converter 18. Further, jitter due to a clock signal noise may be improved since the fourth clock signal CK4 applied to the final parallel-to-serial converter 18 is generated by the second internal power supply voltage VINT2 separated from the first internal power supply voltage VINT1 used for the clock signal generator 24.

Although a configuration in which the parallel-to-serial interface circuit 110 generates the data DATA using one post data is illustrated in FIG. 3, the parallel-to-serial interface circuit 110 may be configured to generate the data DATA using two or more post data.

Further, unlike the example embodiment shown in FIG. 3, the parallel-to-serial interface circuit 110 may be configured to generate single data instead of a differential data pair; in this case, the parallel-to-serial interface circuit 110 may be configured without including the differential data generator 16. Moreover, the parallel-to-serial interface circuit 110 may be configured without including the equalizer selection unit 14 and the differential data generator 16; in this case, the even pre data PR_OD and the odd pre data PR_OD may be applied to the selector 18-2, the inverted odd main data MA_ODB and the inverted even main data MA_EDB may be applied to the selector 18-4, and the even post data PO_ED and the odd post data PO_OD may be applied to the selector 18-6.

Figure 4:
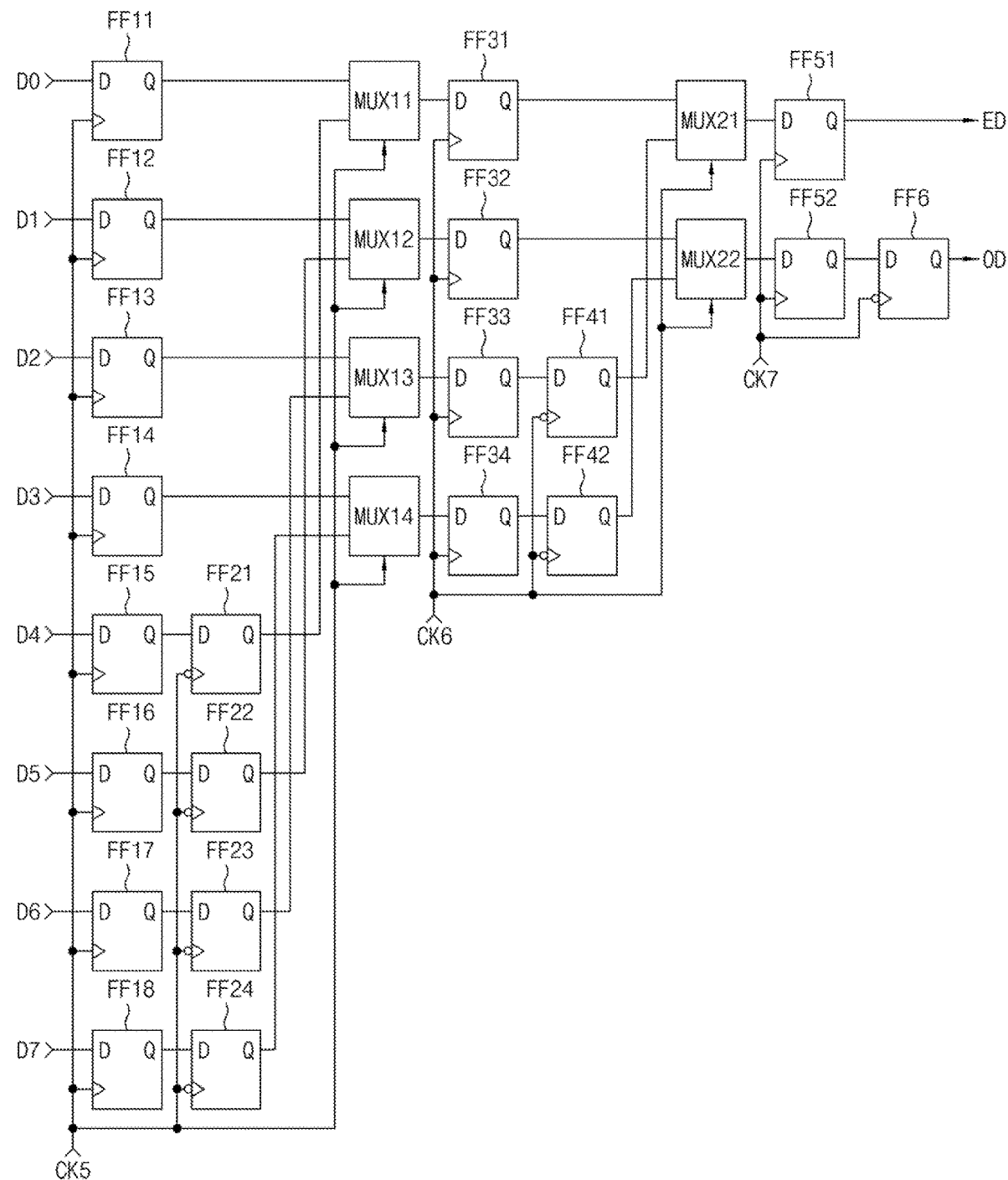
FIG. 4 is a drawing illustrating a configuration of a parallel-to-serial converter according to an example embodiment.

FIG. 4 is a drawing illustrating a configuration of a parallel-to-serial converter according to an example embodiment.

FIG. 4 illustrates a configuration of a parallel-to-serial converter for converting 8-bit parallel data PDI (D0 . . . D7) into 4-bit serial odd data OD and 4-bit serial even data ED.

With reference to FIG. 4, the parallel-to-serial converter 10 may include eight first flip-flops FF11 to FF18, four second flip-flops FF21 to FF24, four first multiplexers MUX11 to MUX14, four third flip-flops FF31 to FF34, two fourth flip-flops FF41 and FF42, two second multiplexers MUX21 and MUX22, two fifth flip-flops FF51 and FF52, and a sixth flip-flop FF6.

Figure 5:
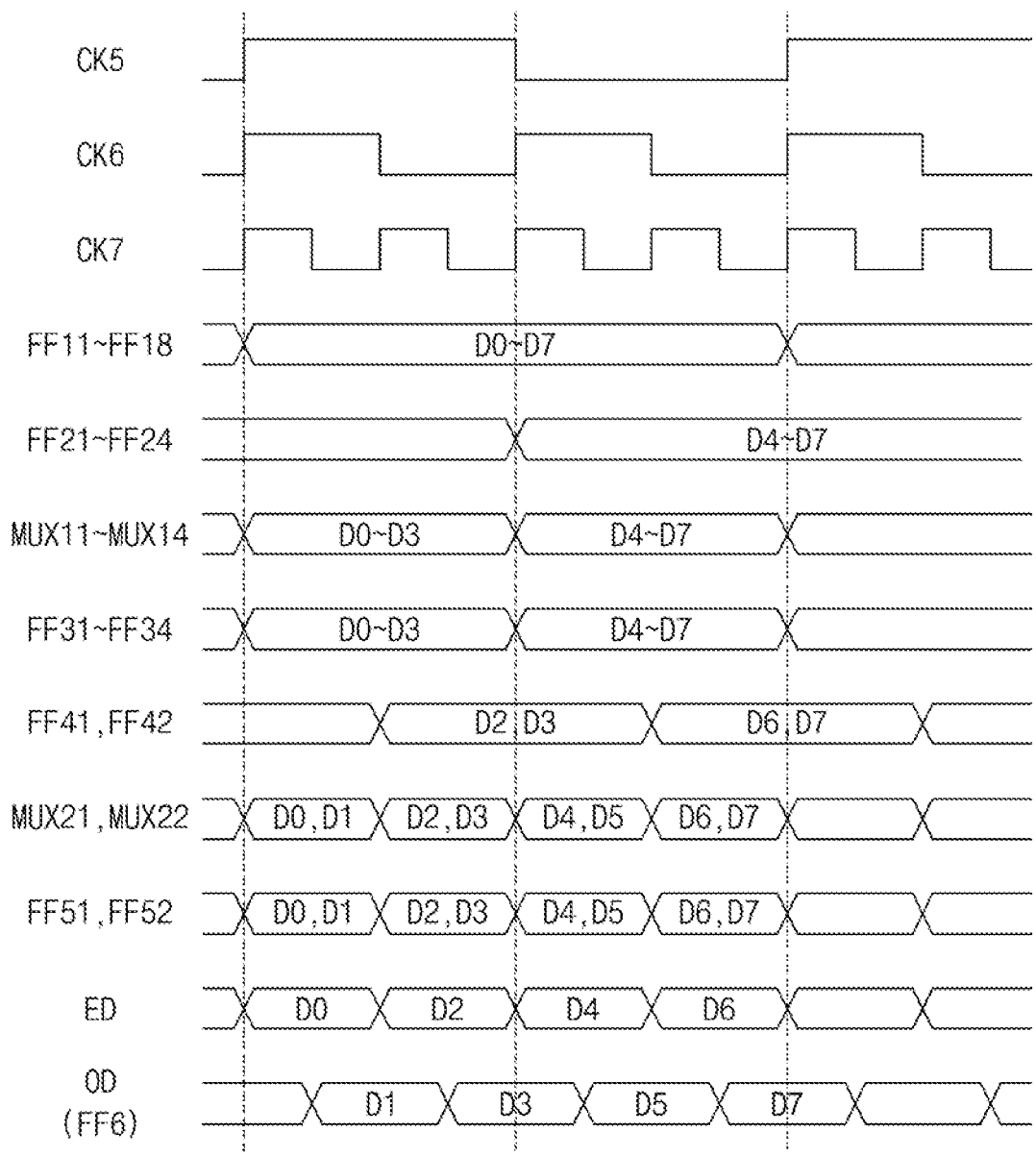
FIG. 5 is an operation timing diagram for describing an operation of a parallel-to-serial converter according to an example embodiment.

FIG. 5 is an operation timing diagram for describing an operation of a parallel-to-serial converter according to an example embodiment.

In FIG. 5, fifth, sixth, and seventh clock signals CK5, CK6, and CK7 may be included in the first clock signal CK1. The fifth clock signal CK5 may be a clock signal obtained by dividing a frequency of the seventh clock signal CK7 by four. The sixth clock signal CK6 may be a clock signal obtained by dividing a frequency of the seventh clock signal CK7 by two.

An operation of the parallel-to-serial converter 10 will be described below with reference to FIG. 4 and FIG. 5.

The eight first flip-flops FF11 to FF18 may latch and output the 8-bit parallel data D0 . . . D7 in response to the fifth clock signal CK5.

The four second flip-flops FF21 to FF24 may latch and output the 4-bit parallel data D4 . . . D7 output from the four first flip-flops FF15 to FF18 in response to an inverted signal of the fifth clock signal CK5 (that is, an inverted fifth clock signal).

The four first multiplexers MUX11 to MUX14 may select and output the 4-bit parallel data D0 . . . D3 in response to the fifth clock signal CK5 (or, not shown in FIG. 4, may select and output the 4-bit parallel data D4 . . . D7 in response to the inverted fifth clock signal CK5).

The four third flip-flops FF31 to FF34 may sequentially latch and output the four-bit parallel data D0 . . . D3 and the four-bit parallel data D4 . . . D7 output from the four first multiplexers MUX11 to MUX14 in response to the sixth clock signal CK6.

The two fourth flip-flops FF41 and FF42 may sequentially latch and output the two-bit parallel data D2D3 and the two-bit parallel data D6D7 output from the four third flip-flops FF33 and FF34 in response to an inverted signal of the sixth clock signal CK6 (that is, an inverted sixth clock signal).

The two second multiplexers MUX21 and MUX22 may select and output the two-bit parallel data D0D1 and the two-bit parallel data D4D5 output from the two third flip-flops FF33 and FF34 in response to the sixth clock signal CK6 (or, not shown in FIG. 4, may select and output the two-bit parallel data D2D3 and the two-bit parallel data D6D7 output from the two fourth flip-flops FF41 and FF42 in response to the inverted sixth clock signal CK6). Thus, the two second multiplexers MUX21 and MUX22 may sequentially output the two-bit parallel data D0D1, the two-bit parallel data D2D3, the two-bit parallel data D4D5, and the two-bit parallel data D6D7 in response to the sixth clock signal CK6.

The two fifth flip-flops FF51 and FF52 may sequentially latch and output the two-bit parallel data D0D1, the two-bit parallel data D2D3, the two-bit parallel data D4D5, and the two-bit parallel data D6D7 output from the two second multiplexers MUX21 and MUX22 in response to the seventh clock signal CK7. At this time, the data D0, the data D2, the data D4, and the data D6 output in series from the fifth flip-flop FF51 may be the odd data OD.

The sixth flip-flops FF6 may sequentially latch and output the data D1, the data D3, the data D5, and the data D7 output from the fifth flip-flop FF52 in response to an inverted signal of the seventh clock signal CK7 (that is, an inverted seventh clock signal). The data D1, the data D3, the data D5, and the data D7 output in series from the sixth flip-flop FF6 in series may be the even data ED.

Figure 6:
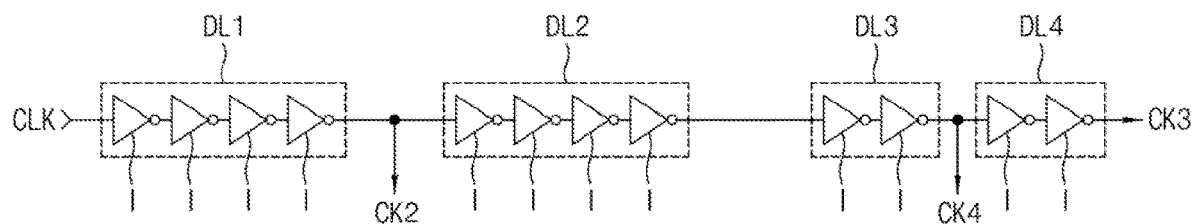
FIG. 6 is a diagram illustrating a configuration of a clock signal transmission delay unit according to an example embodiment.

FIG. 6 is a diagram illustrating a configuration of a clock signal transmission delay unit according to an example embodiment.

The clock signal transmission delay unit 26 may include a first delayer DL1, a second delayer DL2, a third delayer DL3, and a fourth delayer DL4.

With reference to FIG. 6, the first delayer DL1 to the fourth delayer DL4 may be connected in series. Each of the first delayer DL1 and the second delayer DL2 may include four inverters I connected in series. Each of the third delayer DL3 and the fourth delayer DL4 may include two inverters I connected in series.

The first delayer DL1 may delay the reference clock signal CLK to generate the second clock signal CK2. The second delayer DL2 and the third delayer DL3 may delay the second clock signal CK2 to generate the fourth clock signal CK4. The fourth delayer DL4 may delay the fourth clock signal CK4 to generate the third clock signal CK3.

The second clock signal CK2, the third clock signal CK3, and the fourth clock signal CK4 may have the same frequency, and may be generated with a predetermined delay time.

Figure 7A:
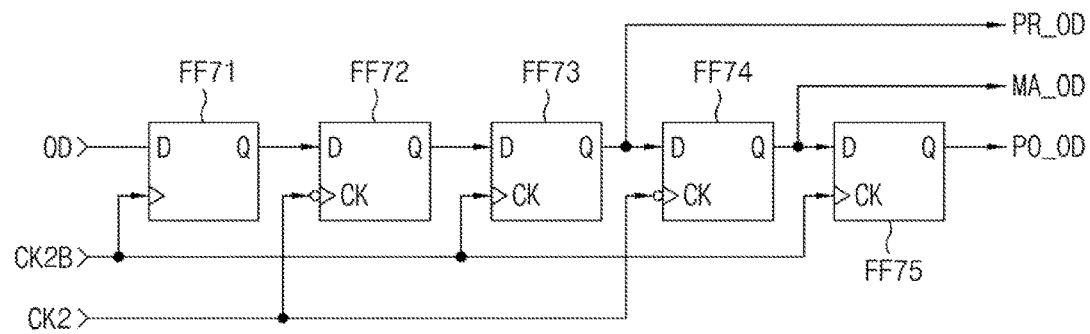
FIG. 7A is a diagram illustrating a configuration of an odd data shift register according to an example embodiment.

FIG. 7A is a diagram illustrating a configuration of an odd data shift register according to an example embodiment.

The odd data shift register 12-2 may include five seventh flip-flops FF71 to FF75.

With reference to FIG. 7A, the five seventh flip-flops FF71 to FF75 may be a 5-bit serial shift register connected in series.

Figure 7B:
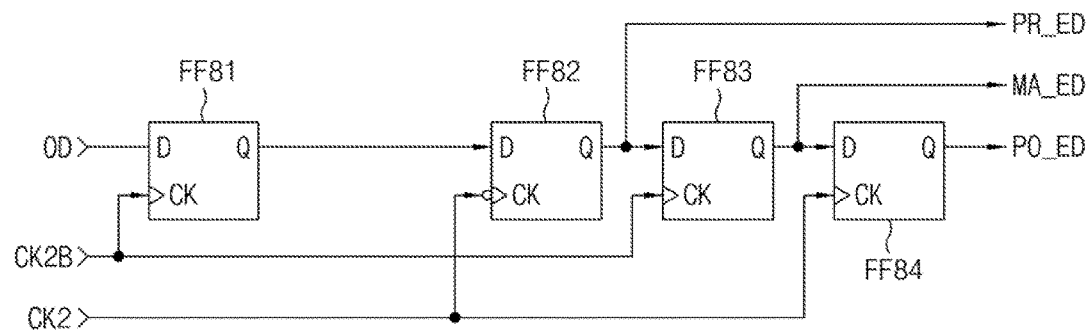
FIG. 7B is a diagram illustrating a configuration of an even data shift register according to an example embodiment.

FIG. 7B is a diagram illustrating a configuration of an even data shift register according to an example embodiment.

The even data shift register 12-4 may include four eighth flip-flops FF81 to FF84.

With reference to FIG. 7B, the four eighth flip-flops FF81 to FF84 may be a 4-bit serial shift register connected in series.

Figure 8:
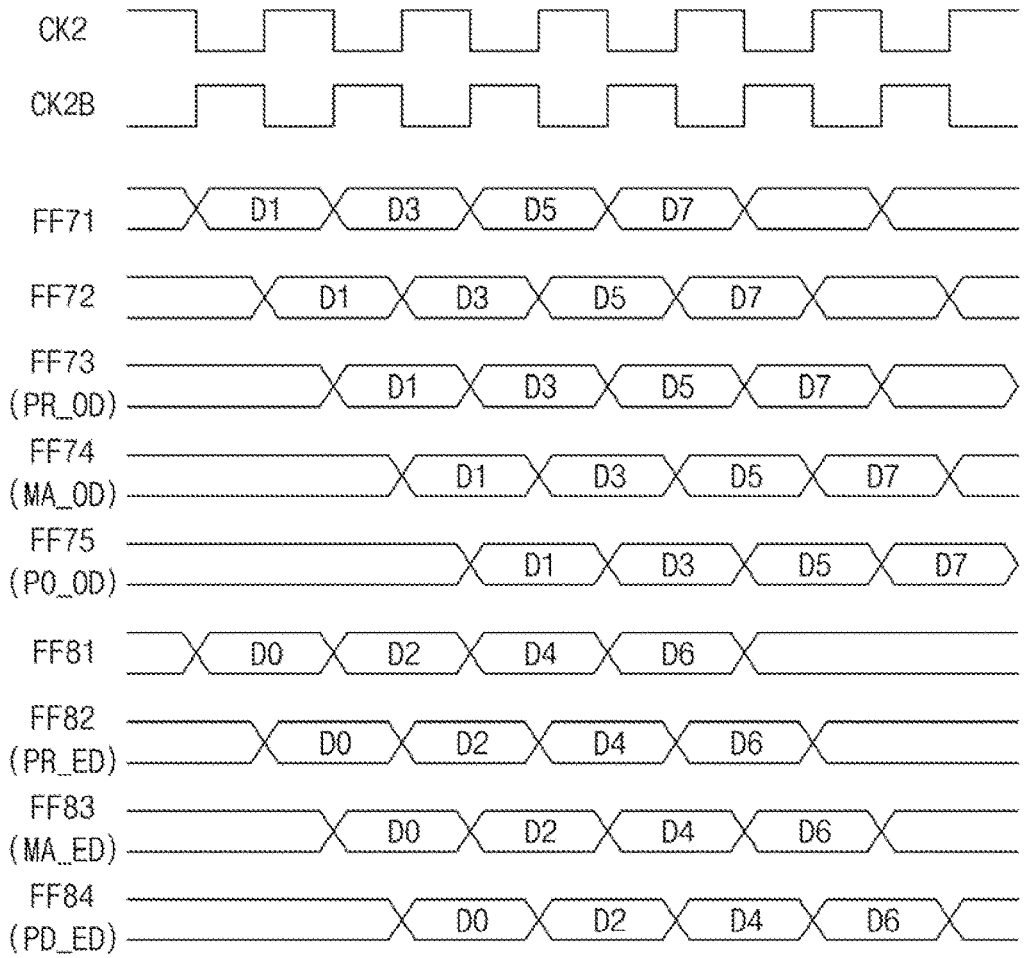
FIG. 8 is an operation timing diagram for describing an operation of an odd data shift register and an even data shift register according to an example embodiment.

FIG. 8 is an operation timing diagram for describing an operation of an odd data shift register and an even data shift register according to an example embodiment.

In FIG. 8, the second clock signal CK2 may have the same frequency as the seventh clock signal CK7.

An operation of the odd data shift register 12-2 will be described below with reference to FIG. 7A and FIG. 8.

The seventh flip-flop FF71 may sequentially latch and output the odd data D1, D3, D5, and D7 in response to an inverted second clock signal CK2B obtained by inverting the second clock signal CK2. The seventh flip-flop FF72 may sequentially latch and output the odd data D1, D3, D5, and D7 output from the previous seventh flip-flop FF71 in response to the second clock signal CK2. The seventh flip-flop FF73 may sequentially latch the odd data D1, D3, D5, and D7 output from the previous seventh flip-flop FF72 in response to the inverted second clock signal CK2B to generate the odd pre data PR_OD. The seventh flip-flop FF74 may sequentially latch the previous seventh flip-flop FF73 in response to the second clock signal CK2 to generate the odd main data MA_OD. The seventh flip-flop FF75 may sequentially latch the odd data D1, D3, D5, and D7 output from the previous seventh flip-flop FF74 in response to the inverted second clock signal CK2B to generate the odd post data PO_OD. Thus, the odd data shift register 12-2 may delay the odd data D1, D3, D5, and D7 by a half period of the second clock signal CK2 to generate the odd pre data PR_OD, the odd main data MA_OD, and the odd post data PO_OD.

An operation of the even data shift register 12-4 will be described below with reference to FIG. 7B and FIG. 8.

The eighth flip-flop FF81 may sequentially latch and output the even data D0, D2, D4, and D6 in response to the inverted second clock signal CK2B. The eighth flip-flop FF82 may sequentially latch the even data D0, D2, D4, and D6 output from the previous eighth flip-flop FF81 in response to the second clock signal CK2 to generate the even pre data PR_ED. The eighth flip-flop FF83 may sequentially latch the even data D0, D2, D4, and D6 output from the previous eighth flip-flop FF82 in response to the inverted second clock signal CK2B to generate the even main data MA_ED. The eighth flip-flop FF84 may sequentially latch the even data D0, D2, D4, and D6 output from the previous eighth flip-flop FF83 in response to the second clock signal CK2 to generate the even post data PO_ED. Thus, the even data shift register 12-4 may delay the even data D0, D2, D4, and D6 by a half period of the second clock signal CK2 to generate the even pre data PR_ED, the even main data MA_ED, and the even post data PO_ED.

Figure 9:
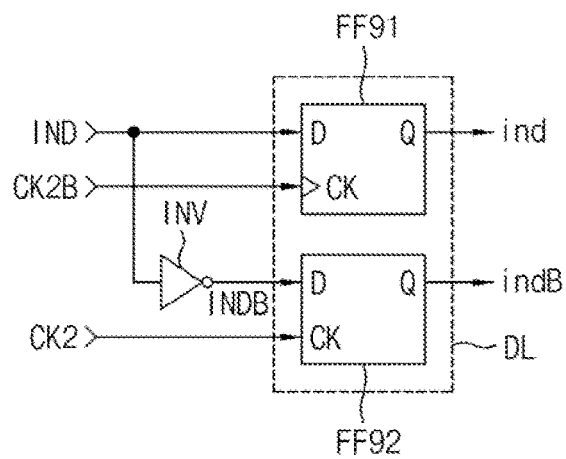
FIG. 9 is a drawing illustrating a configuration of a differential data generator according to an example embodiment.

FIG. 9 is a drawing illustrating a configuration of a differential data generator according to an example embodiment.

Each of the differential data latches DL of the differential data generator 16 may include two ninth flip-flops FF91 and FF92.

With reference to FIG. 9, the ninth flip-flop FF91 may latch the data IND in response to the inverted second clock signal CK2B to generate data ind. The inverter INV may invert the data IND to generate inverted data INDB. The ninth flip-flop FF92 may latch inverted data INDB in response to the second clock signal CK2 to generate inverted data indB.

Figure 10:
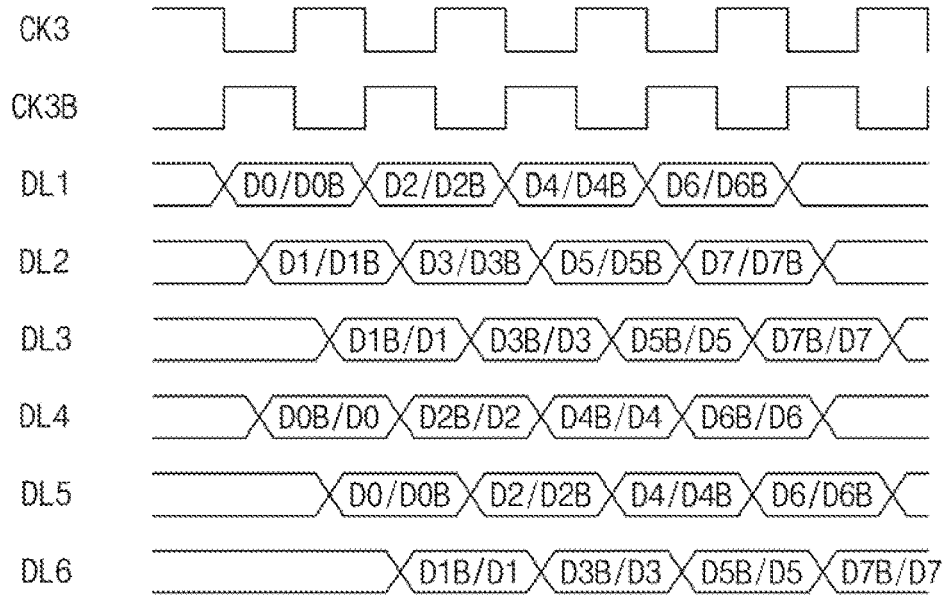
FIG. 10 is an operation timing diagram for describing an operation of a differential data generator according to an example embodiment.

FIG. 10 is an operation timing diagram for describing an operation of a differential data generator according to an example embodiment.

FIG. 10 is a drawing describing an operation when the equalizer enable signal EQ_EN is activated, the even pre data PR_ED and the odd pre data PR_OD are generated from the selector 14-2, inverted odd main data MA_ODB obtained by inverting the odd main data MA_OD and inverted even main data MA_EDB obtained by inverting the even main data MA_ED are generated from the selector 14-4, and the even post data PO_ED and the odd post data PO_OD are generated from the selector 14-6.

An operation of the differential data generator 16 will be described below with reference to FIG. 3, FIG. 9, and FIG. 10.

The differential data latch 16-22 may sequentially latch the even pre data PR_ED (D0, D2, D4, and D6) and the inverted even pre data PR_EDB (D0B, D2B, D4B, and D6B) in response to an inverted third clock signal CK3B obtained by inverting the third clock signal CK3 to sequentially generate a differential even pre data pair PR_ED and PR_EDB (D0/D0B, D2/D2B, D4/D4B, and D6/D6B).

The differential data latch 16-24 may sequentially latch the odd pre data PR_OD (D1, D3, D5, and D7) and the inverted odd pre data PR_ODB (D1B, D3B, D5B, and D7B) in response to the third clock signal CK3 to sequentially generate a differential odd pre data pair PR_OD and PR_ODB (D1/D1B, D3/D3B, D5/D5B, and D7/D7B).

The differential data latch 16-42 may sequentially latch the inverted odd main data MA_ODB (D1B, D3B, D5B, and D7B) and the odd main data MA_ODD (D1, D3, D5, and D7) in response to the inverted third clock signal CK3B to sequentially generate an inverted differential odd main data pair MA_ODB and MA_OD (D1B/D1, D3B/D3, D5B/D5, and D7B/D7).

The differential data latch 16-44 may sequentially latch the inverted even main data MA_EDB (D0B, D2B, D4B, and D6B) and the even main data MA_EDD (D0, D2, D4, and D6) in response to the third clock signal CK3 to sequentially generate an inverted differential even main data pair MA_EDB and MA_ED (D0B/D0, D2B/D2, D4B/D4, and D6B/D6).

The differential data latch 16-62 may sequentially latch the even post data PO_ED (D0, D2, D4, and D6) and the inverted even post data PO_EDB (D0B, D2B, D4B, and D6B) in response to the inverted third clock signal CK3B to sequentially generate a differential even post data pair PO_ED and PO_EDB (D0/D0B, D2/D2B, D4/D4B, and D6/D6B).

The differential data latch 16-64 may sequentially latch the odd post data PO_OD (D1, D3, D5, and D7) and the inverted odd post data PO_ODB (D1B, D3B, D5B, and D7B) in response to the third clock signal CK3 to sequentially generate a differential odd post data pair PO_OD and PO_ODB (D1/D1B, D3/D3B, D5/D5B, and D7/D7B).

Figure 11:
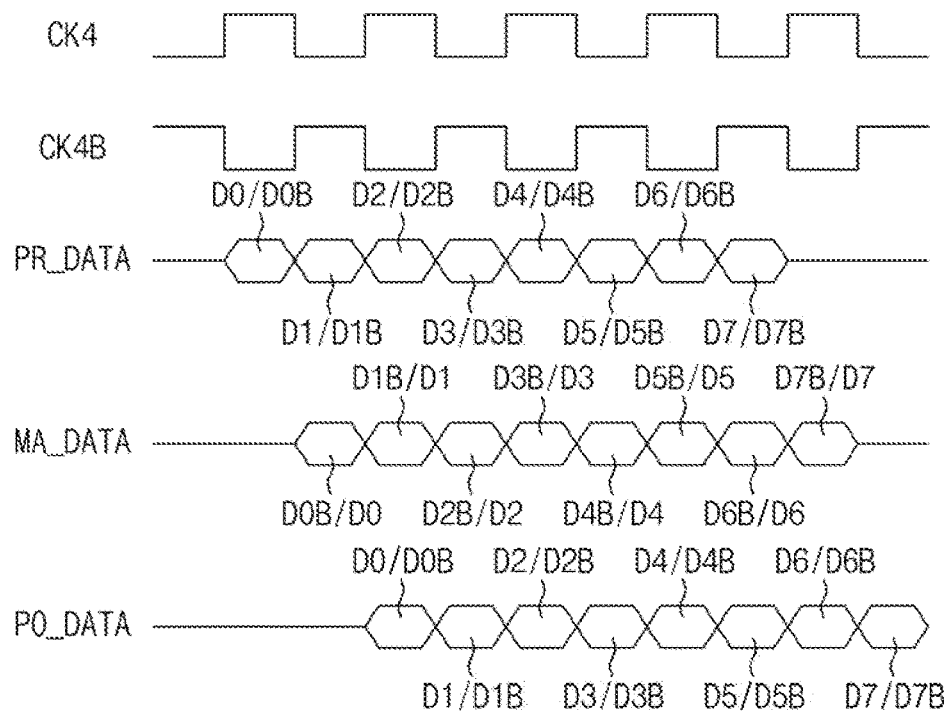
FIG. 11 is an operation timing diagram for describing an operation of a final parallel-to-serial converter according to an example embodiment.

FIG. 11 is an operation timing diagram for describing an operation of a final parallel-to-serial converter according to an example embodiment.

FIG. 11 illustrates a drawing for describing an operation of the final parallel-to-serial converter when the equalizer enable signal EQ_EN is activated.

An operation of the final parallel-to-serial converter 18 will be described below with reference to FIG. 3 and FIGS. 9 to 11.

The selector 18-2 may select the differential even pre data pair PR_ED and PR_EDB (D0/D0B, D2/D2B, D4/D4B, and D6/D6B) in response to the fourth clock signal CK4, or may select the differential odd pre data pair PR_OD and PR_ODB (D1/D1B, D3/D3B, D5/D5B, and D7/D7B) in response to an inverted fourth clock signal CK4B, to generate a differential pre data pair PR_DATA (pr_d and pr_dB). Thus, the selector 18-2 may alternately and sequentially select the differential even pre data pair and the differential odd pre data pair in response to the fourth clock signal CK4 and the inverted fourth clock signal CK4B to generate the differential pre data pair PR_DATA (pr_d and pr_dB).

The selector 18-4 may alternately and sequentially select the inverted differential odd main data pair MA_ODB and MA_ODD (D1B/D1, D2B/D2, D4B/D4, and D6B/D6) and the inverted differential even main data pair MA_EDB and MA_EDD (D0B/D0, D2B/D2, D4B/D4, and D6B/D6) in response to the fourth clock signal CK4 and the inverted fourth clock signal CK4B, to generate a differential main data pair MA_DATA (ma_d and ma_dB).

The selector 18-6 may alternately and sequentially select the differential even post data pair PO_ED and PO_EDB (D0/D0B, D2/D2B, D4/D4B, and D6/D6B) and the differential odd post data pair PO_OD and PO_ODB (D1/D1B, D3/D3B, D5/D5B, and D7/D7B) in response to the fourth clock signal CK4 and the inverted fourth clock signal CK4B, to generate a differential post data pair PO_DATA (po_d and po_dB).

Figure 12:
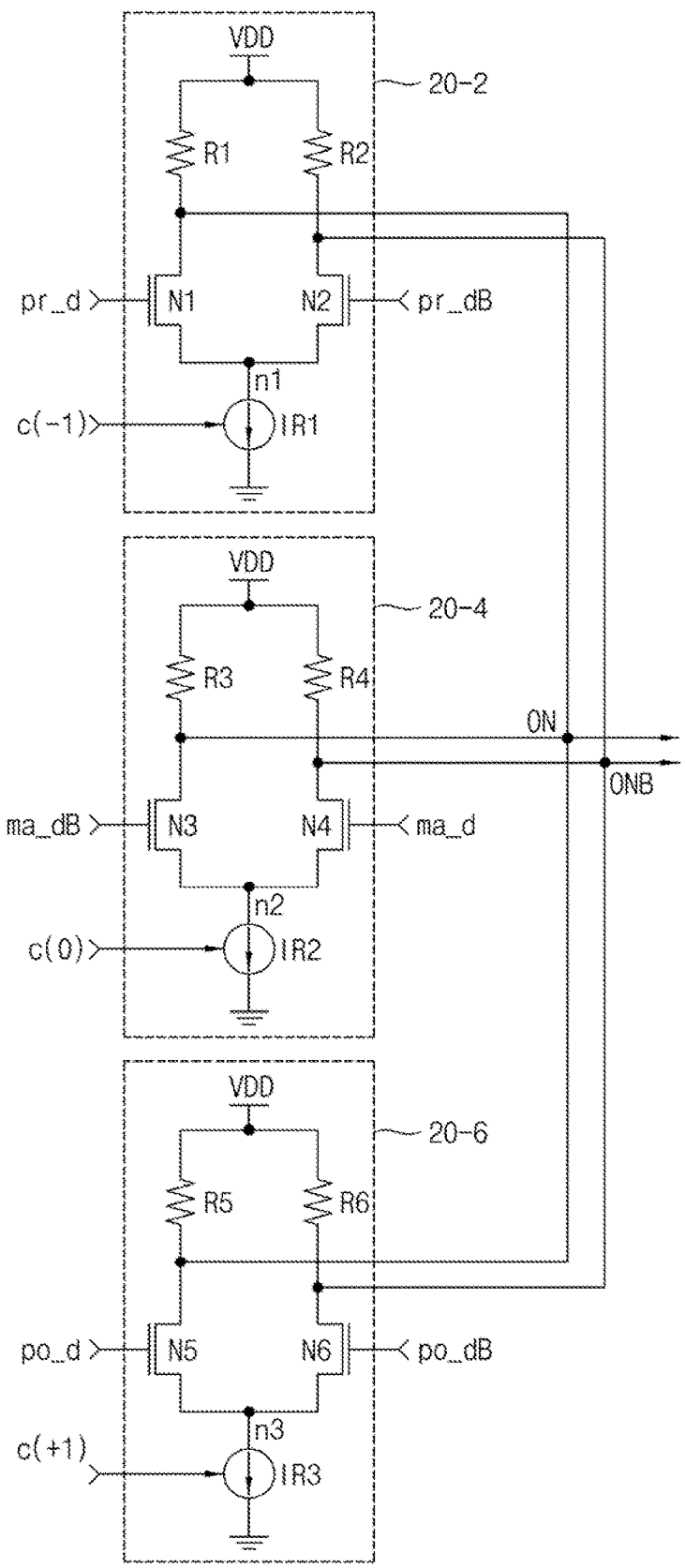
FIG. 12 is a diagram illustrating a configuration of a pre driver, a main driver, and a post driver according to an example embodiment.

FIG. 12 is a diagram illustrating a configuration of a pre driver, a main driver, and a post driver according to an example embodiment.

With reference to FIG. 12, the pre driver 20-2 may include a first resistor R1 and a second resistor R2 each having one end connected to a power supply voltage VDD, a first NMOS transistor N1 having a gate to which the pre data pr_d is applied, a drain connected to the other end of the first resistor R1 and an output node ON, and a source connected to a first node n1, a second NMOS transistor N2 having a gate to which the inverted pre data pr_dB is applied, a drain connected to the other end of the second resistor R2 and an inverted output node ONB, and a source connected the first node n1, and a first variable current source IR1 connected between the first node n1 and a ground voltage.

The main driver 20-4 may include a third resistor R3, a fourth resistor R4, a third NMOS transistor N3, a fourth NMOS transistor N4, and a second variable current source IR2, which have the same configuration as the elements of the pre driver 20-2.

The post driver 20-6 may include a fifth resistor R5, a sixth resistor R6, a fifth NMOS transistor N5, a sixth NMOS transistor N6, and a third variable current source IR3, which have the same configuration as the elements of the pre driver 20-2.

The first variable current source IR1, the second variable current source IR2, and the third variable current source IR3 may be controlled to flow a first current i1, a second current i2, and a third current i3 which are different from each other through the first variable current source IR1, the second variable current source IR2, and the third variable current source IR3 based on a pre-cursor coefficient c(−1), a main-cursor coefficient c(0), and a post-cursor coefficient c(+1).

In FIG. 12, the number of each of the pre drivers 20-2, the main drivers 20-4, and the post drivers 20-6 is 1; however, the number of the pre drivers 20-2, the number of the main drivers 20-4, and the number of the post drivers 20-6 may be different from each other. For example, the number of the pre drivers 20-2 may be 6, the number of the main drivers 20-4 may be 6, and the number of the post drivers 20-6 may be 8.

Figure 13:
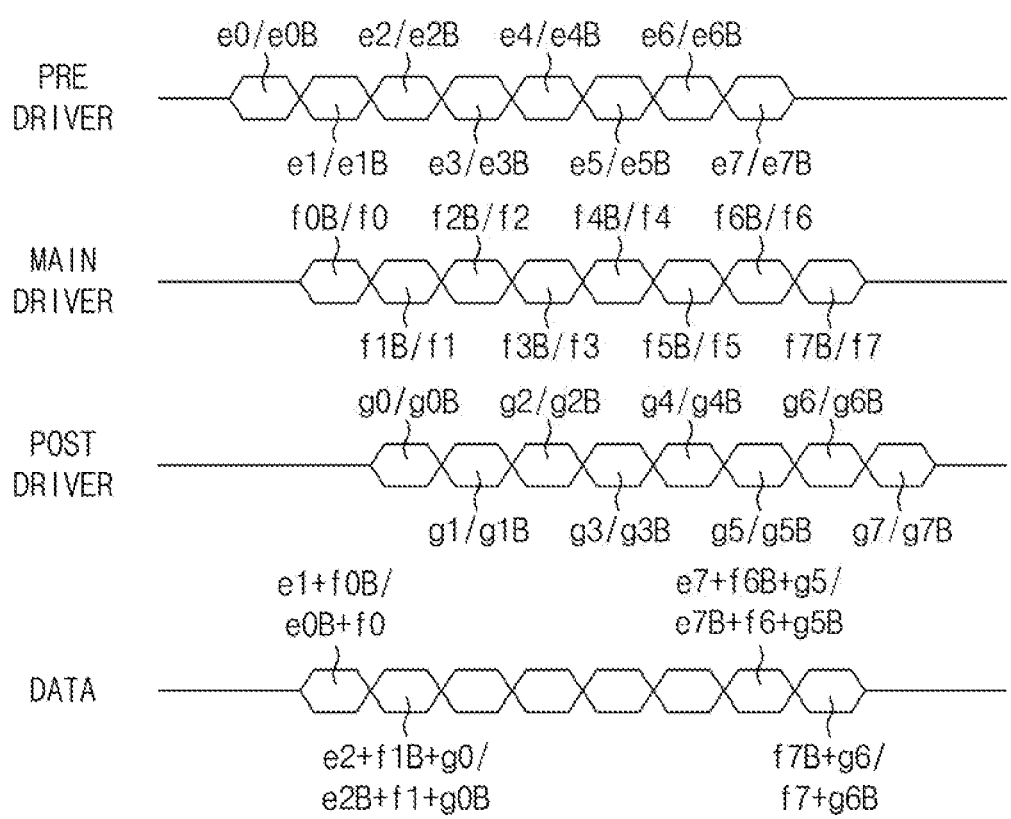
FIG. 13 is an operation timing diagram for conceptually describing an operation of a pre driver, a main driver, and a post driver according to an example embodiment.

FIG. 13 is an operation timing diagram for conceptually describing an operation of a pre driver, a main driver, and a post driver according to an example embodiment.

An operation of the pre driver 20-2, the main driver 20-4, and the post driver 20-6 will be described below with reference to FIG. 12 and FIG. 13.

The pre driver 20-2 may drive a differential pre data pair pr_d and pr_dB based on the pre-cursor coefficient c(−1) (that is, based on the first current i1) to sequentially generate a differential pre data level pair e0/e0B to e7/e7B.

The main driver 20-4 may drive an inverted differential main data pair ma_dB and ma_d based on the main-cursor coefficient c(0) (that is, based on the second current i2) to sequentially generate an inverted differential main data level pair f0B/f0 to f7B/f7.

The post driver 20-6 may drive a differential post data pair po_d and po_dB based on the post-cursor coefficient c(+1) (that is, based on the third current i3) to sequentially generate a differential post data level pair g0/g0B to g7/g7B.

The differential pre data level pair e0/e0B to e7/e7B, the inverted differential main data level pair f0B/f0 to f7B/f7, and the differential post data level pair g0/g0B to g7/g7B may be summed at the output node pair ON and ONB. Thus, the differential data pair e1+f0B/e1B+f0, e2+f1B+g0/e2B+f1+g0B, e7+f6B+g5/e7B+f6+g5B, f7B+g6/f7+g6B may be sequentially output as a data pair DATA through the differential output node pair ON and ONB. For example, the data pair DATA having the characteristic shown in FIG. 2 may be generated.

For example, when the resistors R1 to R6 shown in FIG. 12 have the same resistance r, and the differential pre data pair pr_d and pr_dB, the inverted differential main data pair ma_dB and ma_d, and the differential post data pair po_d and po_dB have the same data, the pre driver 20-2 may generate +(r×(i1)) and −(r×(i1)) as the differential pre data level pair, the main driver 20-4 may generate +(r×(i2)) and −(r×(i2)) as the differential main data level pair, and the post driver 20-6 may generate +(r×(−i3)) and −(r×(−i3)) as the differential post data level pair. Accordingly, the output data pair +(r×(i2−i1−i3) and −(r×(i2−i−i3) may be generated at the differential output node pair ON and ONB.

On the other hand, when the resistors R1 to R6 shown in FIG. 12 have the same resistance r, the differential pre data pair pr_d and pr_dB and the differential post data pair po_d and po_dB have the same data, and the inverted differential main data pair ma_dB and ma_d have different data with the differential pre data pair pr_d and pr_dB, and the differential post data pair po_d and po_dB, the pre driver 20-2 may generate +(r×(i1)) and −(r×(i1)) as the differential pre data level pair, the main driver 20-4 may generate +(r×(i2)) and −(r×(i2)) as the differential main data level pair, and the post driver 20-6 may generate +(r×(i3)) and −(r×(i3)) as the differential post data level pair. Accordingly, the output data pair +(r×(i2+i1+i3)) and -(r×(i2+i1+i3)) may be generated at the differential output node pair ON and ONB.

By way of summation and review, a parallel-to-serial interface circuit may perform a filtering operation of decreasing a low frequency component of output data or increasing a high frequency component of the output data to compensate for distortion that may occur while the output data is transmitted through a channel.

Embodiments may provide a parallel-to-serial interface circuit capable of decreasing jitter of output data, and a transmission device having the same. Embodiments may provide a parallel-to-serial interface circuit that may remove jitter due to a power supply voltage noise occurring prior to the final parallel-to-serial converter by generating the final serial data in response to a clock signal at the final parallel-to-serial converted located at a previous stage of the driver.

Further, the parallel-to-serial interface circuit may improve jitter due to a clock signal noise since the clock signal applied to the final parallel-to-serial converter is generated by the second internal power supply voltage separated from the first internal power supply voltage used for the clock signal generator.

Accordingly, the parallel-to-serial interface circuit and the transmission device including the same may reduce the jitter, and thus improve reliability of the operation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A parallel-to-serial interface circuit, comprising:
   a parallel-to-serial converter configured to convert parallel data in series in response to a first clock signal to generate odd data and even data;
   an equalizer configured to shift the odd data in response to a second clock signal to delay the odd data by a half period of the second clock signal and sequentially generate odd pre data, odd main data, and odd post data, and shift the even data in response to the second clock signal to delay the even data by a half period of the second clock signal and sequentially generate even pre data, even main data, and even post data;
   a final parallel-to-serial converter configured to, in response to a third clock signal, sequentially and alternately select the even pre data and the odd pre data to generate pre data, sequentially and alternately select inverted odd main data obtained by inverting the odd main data and inverted even main data obtained by inverting the even main data to generate inverted main data, and sequentially and alternately select the even post data and the odd post data to generate post data; and
   a driver configured to drive the pre data based on a pre-cursor coefficient to generate a pre data level, drive the inverted main data based on a main-cursor coefficient to generate an inverted main data level, and drive the post data based on a post-cursor coefficient to generate a post data level, wherein:
   the first clock signal and the third clock signal are generated by being supplied with a first internal power supply voltage and a second internal power supply voltage separated from each other,
   the odd pre data is generated at the same time as the even main data, and
   the pre data level, the inverted main data level, and the post data level are summed at an output node of the driver.

2. The parallel-to-serial interface circuit as claimed in claim 1, wherein the equalizer includes:
   an odd data shift register configured to shift the odd data in response to the second clock signal to delay the odd data by a half period of the second clock signal, and sequentially generate the odd pre data, the odd main data, and the odd post data; and
   an even data shift register configured to shift the even data in response to the second clock signal to delay the even data by a half period of the second clock signal, and sequentially generate the even pre data, the even main data, and the even post data.

3. The parallel-to-serial interface circuit as claimed in claim 1, further comprising:
- a first internal power supply voltage generator configured to be supplied with a power supply voltage to generate the first internal power supply voltage;
- a second internal power supply voltage generator configured to be supplied with the power supply voltage to generate the second internal power supply voltage;
- a clock signal generator configured to be supplied with the first internal power supply voltage to generate a reference clock signal;
- a clock signal frequency divider configured to divide a frequency of the reference clock signal to generate the first clock signal; and
- a clock signal transmission delay unit configured to delay the reference clock signal to generate the second clock signal and the third clock signal.

4. The parallel-to-serial interface circuit as claimed in claim 3, further comprising an equalizer selection unit configured to select and output the even pre data and the odd pre data, select and output the inverted odd main data and the inverted even main data, select and output the even post data and the odd post data when an equalizer enable signal is activated, and to select and output the odd main data and the even main data when the equalizer enable signal is deactivated.

5. The parallel-to-serial interface circuit as claimed in claim 4, wherein:
- the clock signal transmission delay unit further generates a fourth clock signal, and
- the parallel-to-serial interface circuit further includes a differential data generator configured to, in response to the fourth clock signal when the equalizer enable signal is activated,
  - generate a differential even pre data pair including the even pre data and inverted even pre data obtained by inverting the even pre data, generate a differential odd main data pair including the inverted odd main data and odd main data obtained by inverting the inverted odd main data, and generate a differential even post data pair including the even post data and inverted even post data obtained by inverting the even post data, or
  - generate a differential odd pre data pair including the odd pre data and inverted odd pre data obtained by inverting the odd pre data, generate a differential even main data pair including the inverted even main data and odd main data obtained by inverting the inverted even main data, and generate a differential odd post data pair including the odd post data and inverted odd post data obtained by inverting the odd post data.

6. The parallel-to-serial interface circuit as claimed in claim 5, wherein the clock signal transmission delay unit delays the reference clock signal to generate the second clock signal, delays the second clock signal to generate the fourth clock signal, and delays the fourth clock signal to generate the third clock signal.

7. The parallel-to-serial interface circuit as claimed in claim 6, wherein, in response to the third clock signal when the equalizer enable signal is activated, the final parallel-to-serial converter is configured to:
- sequentially and alternately select the differential even pre data pair and the differential odd pre data pair to generate a differential pre data pair, sequentially and alternately select the inverted differential odd main data pair and the inverted differential even main data pair to generate an inverted differential main data pair, and
- sequentially and alternately select the differential even post data pair and the differential odd post data pair to generate a differential post data pair.

8. The parallel-to-serial interface circuit as claimed in claim 7, wherein:
the driver includes:
- a pre driver configured to drive the differential even pre data pair based on the pre-cursor coefficient to generate a differential pre data level pair including the pre data level and an inverted pre data level;
- a main driver configured to drive the inverted differential main data pair based on the main-cursor coefficient to generate an inverted differential main data level pair including the inverted main data level and a main data level; and
- a post driver configured to drive the differential post data pair based on the post-cursor coefficient to generate a differential post data level pair including the post data level and an inverted post data level, and
the differential pre data level pair, the inverted differential main data level pair, and the differential post data level pair are summed at an output node pair including the output node and an inverted output node.

9. The parallel-to-serial interface circuit as claimed in claim 8, wherein a number of the pre drivers, a number of the main drivers, and a number of the post driver are the same or different from each other.

10. A parallel-to-serial interface circuit, comprising:
- a parallel-to-serial converter configured to convert parallel data in series in response to a first clock signal to generate odd data and even data;
- an equalizer configured to shift the odd data in response to a second clock signal to delay the odd data by a half period of the second clock signal and sequentially generate odd pre data, odd main data, and odd post data, and shift the even data in response to the second clock signal to delay the even data by a half period of the second clock signal and sequentially generate even pre data, even main data, and even post data;
- an equalizer selection unit configured to, in response to an equalizer enable signal, select and output the even pre data and the odd pre data, select and output inverted odd main data obtained by inverting the odd main data and inverted even main data obtained by inverting the even main data, and select and output the even post data and the odd post data;
- a differential data generator configured to, in response to a third clock signal, generate a differential even pre data pair including the even pre data and inverted even pre data obtained by inverting the even pre data, generate a differential odd main data pair including the inverted odd main data and odd main data obtained by inverting the inverted odd main data, and generate a differential even post data pair including the even post data and inverted even post data obtained by inverting the even post data, or generate a differential odd pre data pair including the odd pre data and inverted odd pre data obtained by inverting the odd pre data, generate a differential even main data pair including the inverted even main data and even main data obtained by inverting the inverted even main data, and generate a differential odd post data pair including the odd post data and inverted odd post data obtained by inverting the odd post data;

a final parallel-to-serial converter configured to, in response to a fourth clock signal, sequentially and alternately select the differential even pre data pair and the differential odd pre data pair to generate a differential pre data pair, sequentially and alternately select the inverted differential odd main data pair and the inverted differential even main data pair to generate an inverted differential main data pair, and sequentially and alternately select the differential even post data pair and the differential odd post data pair to generate a differential post data pair; and a driver configured to drive the differential even pre data pair based on a pre-cursor coefficient to generate a differential pre data level pair, drive the inverted differential main data pair based on a main-cursor coefficient to generate an inverted differential main data level pair, and drive the differential post data pair based on a post-cursor coefficient to generate a differential post data level pair, wherein:

the first clock signal and the fourth clock signal are generated by being supplied with a first internal power supply voltage and a second internal power supply voltage separated from each other, the odd pre data is generated at the same time as the even main data, and the differential pre data level pair, the inverted differential main data level pair, and the differential post data level pair are summed at an output node pair of the driver.

11. The parallel-to-serial interface circuit as claimed in claim 10, further comprising:

a first internal power supply voltage generator configured to be supplied with a power supply voltage to generate the first internal power supply voltage;

a second internal power supply voltage generator configured to be supplied with the power supply voltage to generate the second internal power supply voltage;

a clock signal generator configured to be supplied with the first internal power supply voltage to generate a reference clock signal;

a clock signal frequency divider configured to divide a frequency of the reference clock signal to generate the first clock signal; and a clock signal transmission delay unit configured to delay the reference clock signal to generate the second clock signal, the third clock signal, and the fourth clock signal.

12. The parallel-to-serial interface circuit as claimed in claim 11, wherein the clock signal transmission delay unit is configured to delay the reference clock signal to generate the second clock signal, delay the second clock signal to generate the fourth clock signal, and delay the fourth clock signal to generate the third clock signal.

13. A transmission device, comprising:

a parallel-to-serial interface circuit configured to convert internally generated parallel data in series to output data, wherein:

the parallel-to-serial interface circuit includes:

a parallel-to-serial converter configured to convert the parallel data in series in response to a first clock signal to generate odd data and even data;

an equalizer configured to shift the odd data in response to a second clock signal to delay the odd data by a half period of the second clock signal and sequentially generate odd pre data, odd main data, and odd post data, and shift the even data in response to the second clock signal to delay the even data by a half period of the second clock signal and sequentially generate even pre data, even main data, and even post data;

a final parallel-to-serial converter configured to, in response to a third clock signal, sequentially and alternately select the even pre data and the odd pre data to generate pre data, sequentially and alternately select inverted odd main data obtained by inverting the odd main data and inverted even main data obtained by inverting the even main data to generate inverted main data, and sequentially and alternately select the even post data and the odd post data to generate post data; and a driver configured to drive the pre data based on a pre-cursor coefficient to generate a pre data level, drive the inverted main data based on a main-cursor coefficient to generate an inverted main data level, and drive the post data based on a post-cursor coefficient to generate a post data level, the first clock signal and the third clock signal are generated by being supplied with a first internal power supply voltage and a second internal power supply voltage separated from each other, the odd pre data is generated at the same time as the even main data, and the pre data level, the inverted main data level, and the post data level are summed at an output node of the driver.

14. The transmission device as claimed in claim 13, wherein the equalizer includes:

an odd data shift register configured to shift the odd data in response to the second clock signal to delay the odd data by a half period of the second clock signal, and sequentially generate the odd pre data, the odd main data, and the odd post data; and an even data shift register configured to shift the even data in response to the second clock signal to delay the even data by a half period of the second clock signal, and sequentially generate the even pre data, the even main data, and the even post data.

15. The transmission device as claimed in claim 13, further comprising:

a first internal power supply voltage generator configured to be supplied with a power supply voltage to generate the first internal power supply voltage;

a second internal power supply voltage generator configured to be supplied with the power supply voltage to generate the second internal power supply voltage;

a clock signal generator configured to be supplied with the first internal power supply voltage to generate a reference clock signal;

a clock signal frequency divider configured to divide a frequency of the reference clock signal to generate the first clock signal; and a clock signal transmission delay unit configured to delay the reference clock signal to generate the second clock signal and the third clock signal.

16. The transmission device as claimed in claim 15, further comprising an equalizer selection unit configured to select and output the even pre data and the odd pre data, select and output the inverted odd main data and the inverted even main data, select and output the even post data and the odd post data when an equalizer enable signal is activated, and to select and output the odd main data and the even main data when the equalizer enable signal is deactivated.

17. The transmission device as claimed in claim 16, wherein:
- the clock signal transmission delay unit further generates a fourth clock signal, and
- the parallel-to-serial interface circuit further includes a differential data generator configured to, in response to the fourth clock signal when the equalizer enable signal is activated,
- generate a differential even pre data pair including the even pre data and inverted even pre data obtained by inverting the even pre data, generate a differential odd main data pair including the inverted odd main data and odd main data obtained by inverting the inverted odd main data, and generate a differential even post data pair including the even post data and inverted even post data obtained by inverting the even post data, or
- generate a differential odd pre data pair including the odd pre data and inverted odd pre data obtained by inverting the odd pre data, generate a differential even main data pair including the inverted even main data and odd main data obtained by inverting the inverted even main data, and generate a differential odd post data pair including the odd post data and inverted odd post data obtained by inverting the odd post data.

18. The transmission device as claimed in claim 17, wherein the clock signal transmission delay unit is configured to delay the reference clock signal to generate the second clock signal, delay the second clock signal to generate the fourth clock signal, and delay the fourth clock signal to generate the third clock signal.

19. The transmission device as claimed in claim 18, wherein, in response to the third clock signal when the equalizer enable signal is activated, the final parallel-to-serial converter is configured to:
- sequentially and alternately select the differential even pre data pair and the differential odd pre data pair to generate a differential pre data pair,
- sequentially and alternately select the inverted differential odd main data pair and the inverted differential even main data pair to generate an inverted differential main data pair, and
- sequentially and alternately select the differential even post data pair and the differential odd post data pair to generate a differential post data pair.

20. The transmission device as claimed in claim 19, wherein:
- the driver includes:
  - a pre driver configured to drive the differential even pre data pair based on the pre-cursor coefficient to generate a differential pre data level pair including the pre data level and an inverted pre data level;
  - a main driver configured to drive the inverted differential main data pair based on the main-cursor coefficient to generate an inverted differential main data level pair including the inverted main data level and a main data level; and
  - a post driver configured to drive the differential post data pair based on the post-cursor coefficient to generate a differential post data level pair including the post data level and an inverted post data level,
- the differential pre data level pair, the inverted differential main data level pair, and the differential post data level pair are summed at an output node pair including the output node and an inverted output node, and
- a number of the pre drivers, a number of the main drivers, and a number of the post driver are the same or different from each other.

* * * * *